United States Patent

Ruha et al.

(10) Patent No.: US 6,819,177 B2
(45) Date of Patent: Nov. 16, 2004

(54) ELECTRONIC CIRCUIT FOR A SWITCHING POWER AMPLIFIER AND METHOD FOR SWITCHING THE OUTPUT STAGE OF A SWITCHING POWER AMPLIFIER

(75) Inventors: Antti Ruha, Oulu (FI); Tarmo Ruotsalainen, Oulu (FI); Jussi-Pekka Tervaluoto, Oulu (FI); Jani Kauppinen, Oulu (FI)

(73) Assignee: Nokia Corporation, Espoo (FI)

( * ) Notice: Subject to any disclaimer, the term of this patent is extended or adjusted under 35 U.S.C. 154(b) by 14 days.

(21) Appl. No.: 10/460,772

(22) Filed: Jun. 11, 2003

(65) Prior Publication Data

US 2004/0004517 A1 Jan. 8, 2004

(30) Foreign Application Priority Data

Jun. 14, 2002 (EP) .............................................. 02013141

(51) Int. Cl.[7] .............................. H03F 21/00; H03F 3/38
(52) U.S. Cl. ....................... 330/207 A; 330/251; 330/10
(58) Field of Search ....................... 330/10, 146, 207 A, 330/251

(56) References Cited

U.S. PATENT DOCUMENTS

| | | | |
|---|---|---|---|
| 5,422,597 A | 6/1995 | Stengel et al. | 330/10 |
| 5,613,010 A * | 3/1997 | Heyl et al. | 330/251 |
| 5,657,219 A | 8/1997 | Stanley | 363/132 |
| 5,982,231 A * | 11/1999 | Nalbant | 330/207 A |
| 6,288,605 B1 | 9/2001 | Botti et al. | 330/10 |
| 6,362,683 B1 | 3/2002 | Miao et al. | 330/10 |
| 6,538,504 B1 * | 3/2003 | Kirn | 330/207 A |
| 6,605,991 B2 * | 8/2003 | Midya et al. | 330/251 |

OTHER PUBLICATIONS

"The Interleaved Operation of Power Amplifiers" by F. Robinson Power Electronics and Variable Speed Drives, Sep. 21–23, 1998. Conference Publication No. 456, pp. 606–611.

* cited by examiner

Primary Examiner—Khanh Van Nguyen (57) ABSTRACT

An electronic circuit for a switching power amplifier is shown where in order to reduce problems during the transition stage when switching an output stage of the amplifier, the circuit comprises an output stage formed by at least two switching stages 54,55. Each of the switching stages 54,55 comprises at least two power switches and provides an output between the at least two power switches. Further, the switching stages 54,55 are connected in parallel to each other. The proposed circuit comprises in addition clocking means for switching the power switches, wherein the clocking means switch the power switches of at least one of the switching stages 55 in an overlapped mode and the power switches of at least one other of the switching stages 54 in a non-overlapped mode. The invention relates equally to a corresponding method.

17 Claims, 5 Drawing Sheets

ELECTRONIC CIRCUIT FOR A SWITCHING POWER AMPLIFIER AND METHOD FOR SWITCHING THE OUTPUT STAGE OF A SWITCHING POWER AMPLIFIER

CROSS-REFERENCE TO RELATED APPLICATION

Priority is claimed from European Application No. 02 013 141 filed Jun. 14, 2002 under 35 U.S.C. § 119.

FIELD OF THE INVENTION

The invention relates to an electronic circuit for a switching power amplifier, to a switching power amplifier, to an integrated circuit comprising an electronic circuit for a switching power amplifier and to a device comprising a switching power amplifier. The invention relates equally to a method for switching the output stage of a switching power amplifier.

BACKGROUND OF THE INVENTION

It is well known to employ switching power amplifiers in a variety of fields, e.g. in motor control, as switching RF (radio frequency) power amplifiers or as class D audio amplifiers, wherein amplifiers are categorized into class A, B, C, D, etc. by their properties. Typically, the load of a switching amplifier is a circuit containing an inductive component, for instance a motor or a speaker.

The main motivation to use switching power amplifiers is their high power efficiency. In portable devices, like mobile phones, a high power efficiency increases the operation time and decreases the heat dissipation and the resulting heating of the device. Another reason for using switching power amplifiers instead of linear amplifiers is the difficulties in implementing linear amplifiers with current low-voltage semiconductor technologies.

In switching power amplifiers, the output power provided to a load is controlled by switching power switches in the output stage of the amplifier. The output stage of a switching power amplifier can be implemented instance with PMOS and NMOS transistors or with PNP and NPN transistors in an inverter topology, where the transistors constitute controllable power switches of the output stage. The output stage can further be single-ended or differential.

Figure 1:
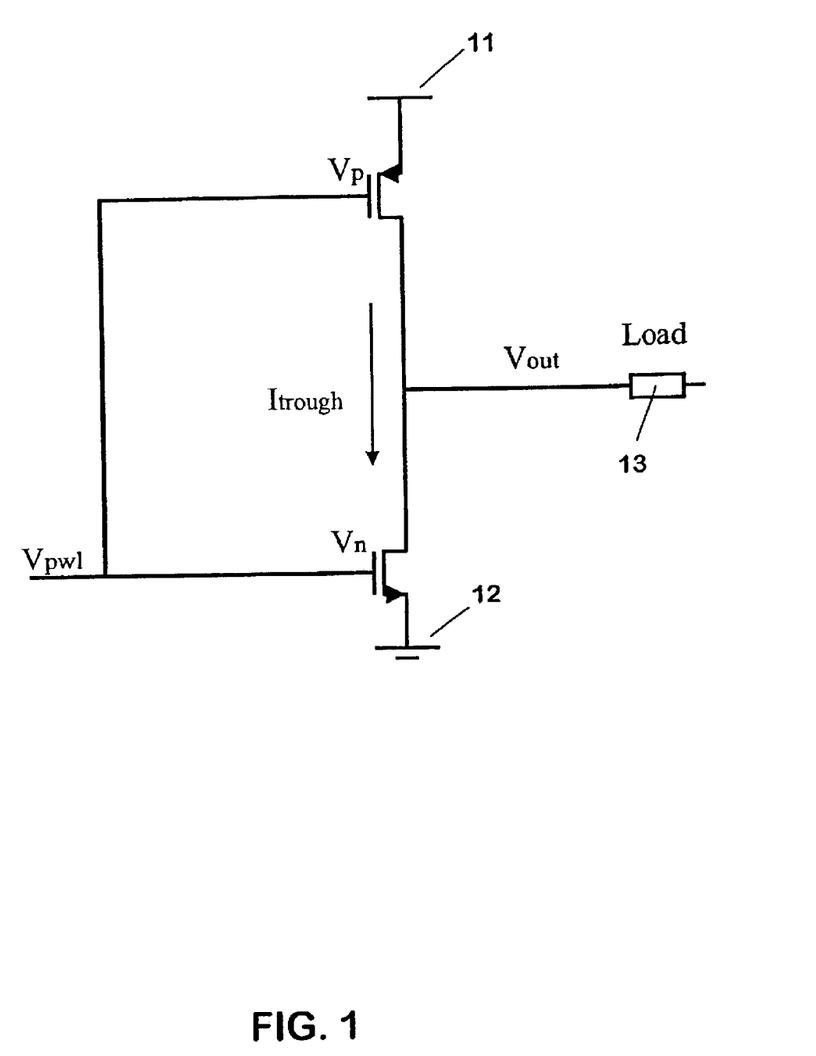

FIG. 1 illustrates the principle of a single-ended output stage of a switching power amplifier. In FIG. 1, a PMOS transistor $V_p$ and an NMOS transistor $V_n$, connected in series between a voltage supply 11 and ground 12, constitute a single-ended output stage. The transistors $V_p$, $V_n$ are controlled by a common input signal $V_{pwl}$. The input signal $V_{pwl}$ has an alternating polarity and is provided by clocking means not shown in the figure. The output of the output stage is provided between the two transistors $V_p$, $V_n$. Currently, a load 13 is connected to this output. At the output of the output stage, a voltage $V_{out}$ is provided to the connected load 13. Due to the alternating input signal $V_{pwl}$, the output stage alternates between a first phase, in which a current is able to flow from load 13 via transistor $V_n$ to ground 12, and a second phase, in which a current is able to flow from voltage supply 11 via transistor $V_p$ to load 13. In a situation in which both transistors $V_p$, $V_n$ are turned on, a current $I_{through}$ may flow from the branch comprising transistor $V_p$ to the branch comprising transistor $V_n$. Alternatively, a separate input signal could be provided to the two transistors $V_p$, $V_n$.

Figure 2:
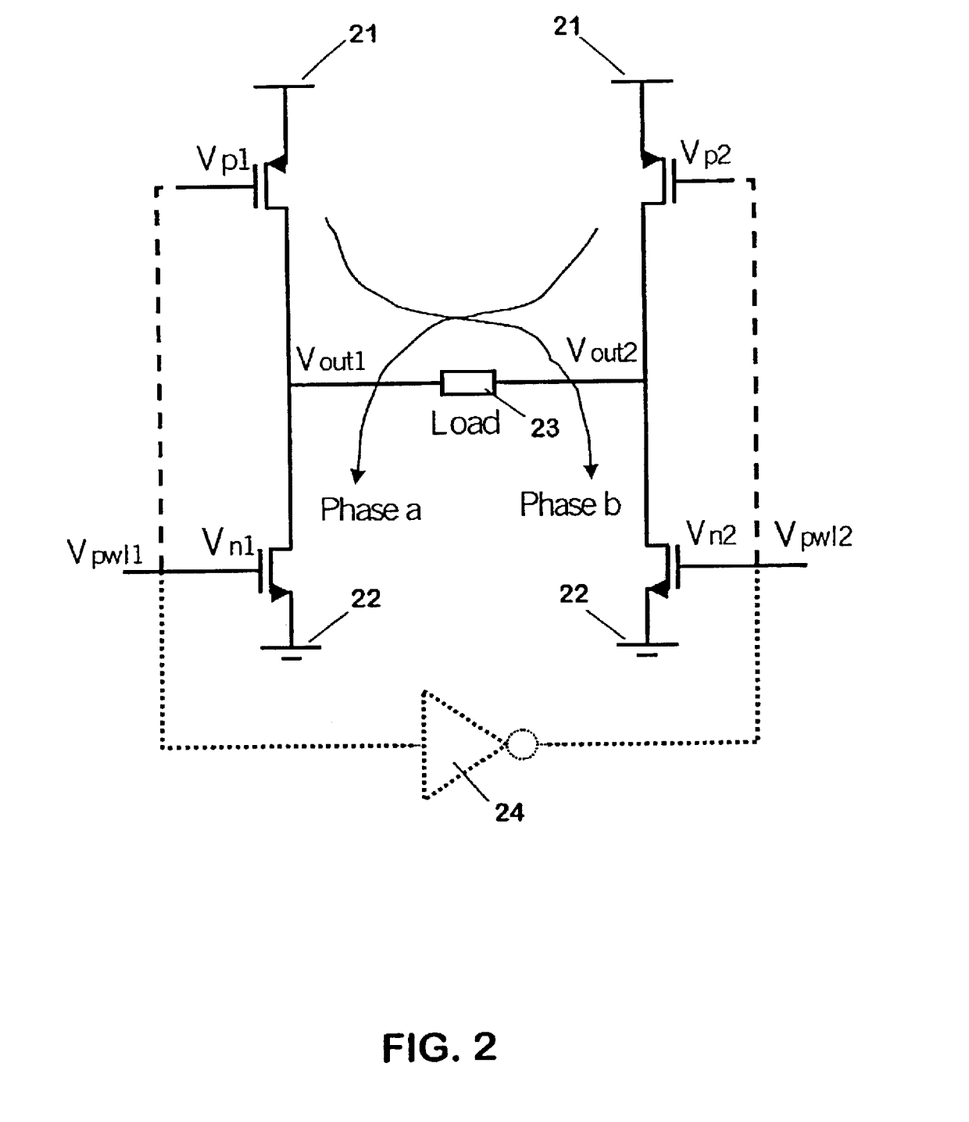
FIG. 2 schematically shows an embodiment of a known differential output stage for various clocking alternatives.

A differential output stage, which is also referred to as H bridge, can be implemented by combining two appropriately clocked single-ended output stages. The load is arranged in this case between the outputs of the two single-ended switching stages. FIG. 2 illustrates the principle of such a differential output stage.

On the one hand, a first PMOS transistor $V_{p1}$, and a first NMOS transistor $V_{n1}$ are connected in series between a voltage supply 21 and ground 22. On the other hand, a second PMOS transistor $V_{p2}$ and a second NMOS transistor $V_{n2}$ are connected in series between voltage supply 21 and ground 22. The connection between transistors $V_{p1}$, and $V_{n1}$ forms a first output of the differential output stage, and the connection between transistors $V_{p2}$ and $V_{n2}$ forms a second output of the differential output stage. Currently, a load 23 is connected between the first and the second output of the output stage. The output voltage at the first output is referred to as $V_{out1}$, while the output voltage at the second output is referred to as $V_{out2}$.

The four transistors are controlled such that the signals input on the one hand to transistors $V_{n1}$, and $V_{p1}$, and on the other hand to transistors $V_2$ and $V_{p2}$ have mainly an opposite, alternating polarity. This can be achieved in different ways. In one alternative, each of the transistors is controlled with a separate input signal. In another alternative, transistors $V_{p1}$ and $V_{n1}$ are controlled with a first input signal $V_{pwl1}$, while transistors $V_{p2}$ and $V_{n2}$ are controlled with a second input signal $V_{pwl2}$. The input signals $V_{pwl1}$ and $V_{pwl2}$ can be provided e.g. by a class BD modulation block. Class BD is used for three-level class D switching amplifiers. This second possibility is indicated in FIG. 2 with a dashed line between a first input signal $V_{pwl1}$ fed to transistor $V_{n1}$ and transistor $V_{p1}$, and with a dashed line between a second input signal $V_{pwl2}$ fed to transistor $V_{n2}$ and transistor $V_{p2}$ In a further alternative, all transistors are controlled by a single input signal. To this end, an input signal $V_{pwl1}$ is provided by clocking means (not shown) and fed to transistors $V_{n1}$ and $V_{p1}$ as in the second alternative, while the input signal for transistors $V_{n2}$ and $V_{p2}$ is obtained by an inverter 24, to which input signal $V_{pwl1}$ is fed. Thereby, a separate second input signal $V_{pwl2}$ is not required. This possibility is indicated in FIG. 2 with additional dotted lines.

Due to the alternating input signals, e.g. $V_{pwl1}$ and $V_{pwl2}$, the output stage alternates between a first phase a, in which a current is able to flow from voltage supply 21 via transistor $V_{p2}$, load 23 and transistor $V_{n1}$ to ground 22, and a second phase b, in which a current is able to flow from voltage supply 21 via transistor $V_{p1}$, load 23 and transistor $V_{n2}$ to ground 22.

In both cases, i.e. in the case of a single-ended output stage and in the case of differential output stages, the transition between the respective first phase and the respective second phase can be realized by switching the power switches of the output stage in an overlapping mode or in a non-overlapping mode.

Figure 3A:
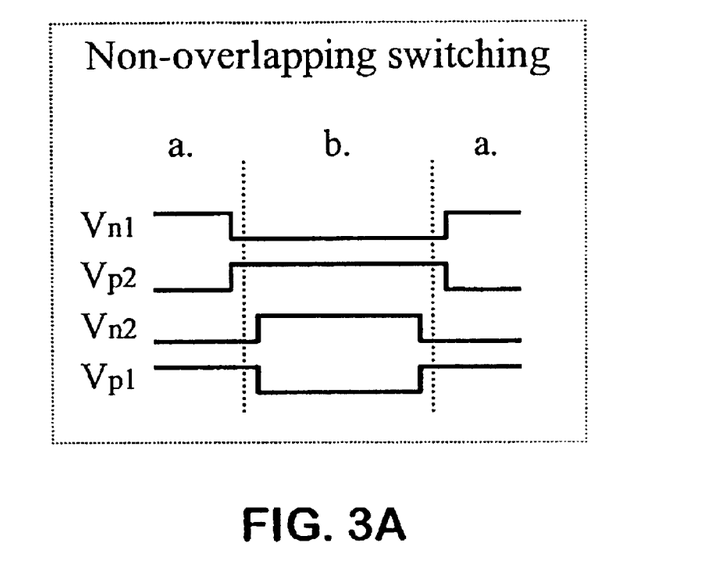
FIG. 3A illustrates non-overlapping switching employed for the output stage of FIG. 2.
Figure 3B:
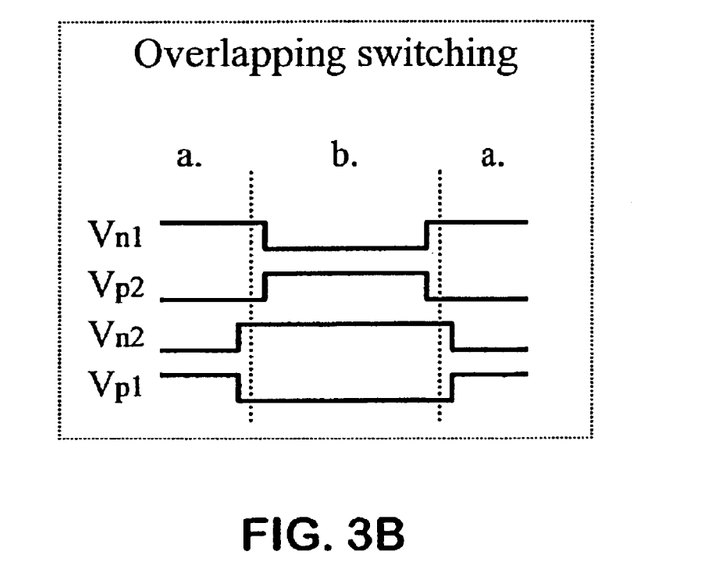
FIG. 3B illustrates overlapping switching employed for the output stage of FIG. 2.

FIG. 3A illustrates a non-overlapping switching and FIG. 3B an overlapping switching for the differential output stage presented in FIG. 2. In both figures, the signals provided to the transistors $V_{n1}$, $V_{p2}$, $V_{n2}$ and $V_{p1}$ are shown for two consecutive transitions, more specifically for a first transition from phase a to phase b and for a subsequent transition back to phase a. For both transitions, a reference time is indicated by a vertical dotted line.

A non-overlapping mode can be achieved for a differential switching stage as depicted in FIG. 2 by providing four separate switching signals for transistors $V_{p1}$, $V_{n1}$, $V_{p2}$ and $V_{n2}$. In FIG. 3A, the non-overlapping signals supplied to transistors $V_{n1}$ and transistor $V_{p1}$ have a high level in the initial phase a, while the signals supplied to transistor $V_{p2}$ and transistor $V_{n2}$ have a low level in the initial phase a. Shortly before the reference time for the first transition from phase a to phase b, the signal supplied to transistor $V_{n1}$ is switched to a low level and the signal supplied to transistor $V_{p2}$ is switched to a high level. This has the effect of turning the transistors $V_{n1}$ and $V_{p2}$ off such that all power transistors are turned off. Shortly after the reference time for the first transition, the signal supplied to transistor $V_{n2}$ is switched to a high level and the signal supplied to transistor $V_{p1}$ is switched to a low level. This has the effect of turning the transistors $V_{n2}$ and $V_{p1}$ on. Shortly before the reference time for the second transition back from phase b to phase a, the signal supplied to transistor $V_{n2}$ is switched again to a low level and the signal supplied to transistor $V_{p1}$ is switched again to a high level. This has the effect of turning the transistors $V_{n2}$ and $V_{p1}$ off such that all power transistors are turned off again. Shortly after the reference time for the second transition, the signal supplied to transistor $V_{n1}$ is switched again to a high level and the signal supplied to transistor $V_{p2}$ is switched again to a low level. This has the effect of turning the transistors $V_{n1}$ and $V_{p2}$ on. For both transitions, thus all of the transistors $V_{n1}$, $V_{p2}$, $V_{n2}$ and $V_{p1}$ are briefly turned off at the same time during the period of time between the switching shortly before the respective reference time and the switching shortly after the respective reference time.

A non-overlapping mode can be achieved correspondingly for a single ended switching stage as depicted in FIG. 1 by providing two separate switching signals for transistors $V_p$ and $V_n$.

An overlapping mode can be achieved for a differential switching stage as depicted in FIG. 2 with a single common input signal, with two input signals or with four separate switching signals for transistors $V_{p1}$, $V_{n1}$, $V_{p2}$ and $V_{n2}$ as described above with reference to FIG. 2. In FIG. 3B, the overlapping signals supplied to transistor $V_{n1}$ and transistor $V_{p1}$ have as well a high level in the initial phase a, while the signals supplied to transistor $V_{p2}$ and transistor $V_{n2}$ have as well a low level in the initial phase a. In this case, however, the signal supplied to transistor $V_{n2}$ is switched to a high level and the signal supplied to transistor $V_{p1}$ is switched to a low level already shortly before the reference time for the first transition from phase a to phase b. The signal supplied to transistor $V_{n1}$ is switched to a low level and the signal supplied to transistor $V_{p2}$ is switched to a high level only shortly after the reference time for the first transition. Accordingly, shortly before the reference time for the second transition back from phase b to phase a, the signal supplied to transistor $V_{n1}$ is switched again to a high level and the signal supplied to transistor $V_{p2}$ is switched again to a low level. Shortly after the reference time for the second transition, the signal supplied to transistor $V_{n2}$ is switched again to a low level and the signal supplied to transistor $V_{p1}$ is switched again to a high level. For both transitions, thus all of the transistors $V_1$, $V_{p2}$, $V_{n2}$ and $V_{p1}$ are briefly turned on at the same time during the period of time between the switching shortly before the respective reference time and the switching shortly after the respective reference time.

An overlapping mode can be achieved correspondingly for a single ended switching stage as depicted in FIG. 1 by providing a single switching signal or two separate switching signals for transistors $V_p$ and $V_n$.

The clocking sequence employed for switching the output stage depends on the pulse width modulation (PWM) scheme used. A typical PWM scheme is class BD.

Regardless of the modulation used, some problems may occur during the switching of the power switches as well in the case of single-ended output stages as in the case of differential output stages.

A first type of problem occurs if the effective clocking is overlapping, as illustrated in FIG. 3B. Even in case all power switches conduct simultaneously only for a short period of time, large current spikes will flow from the voltage supply through the power switches to ground.

Figure 4:
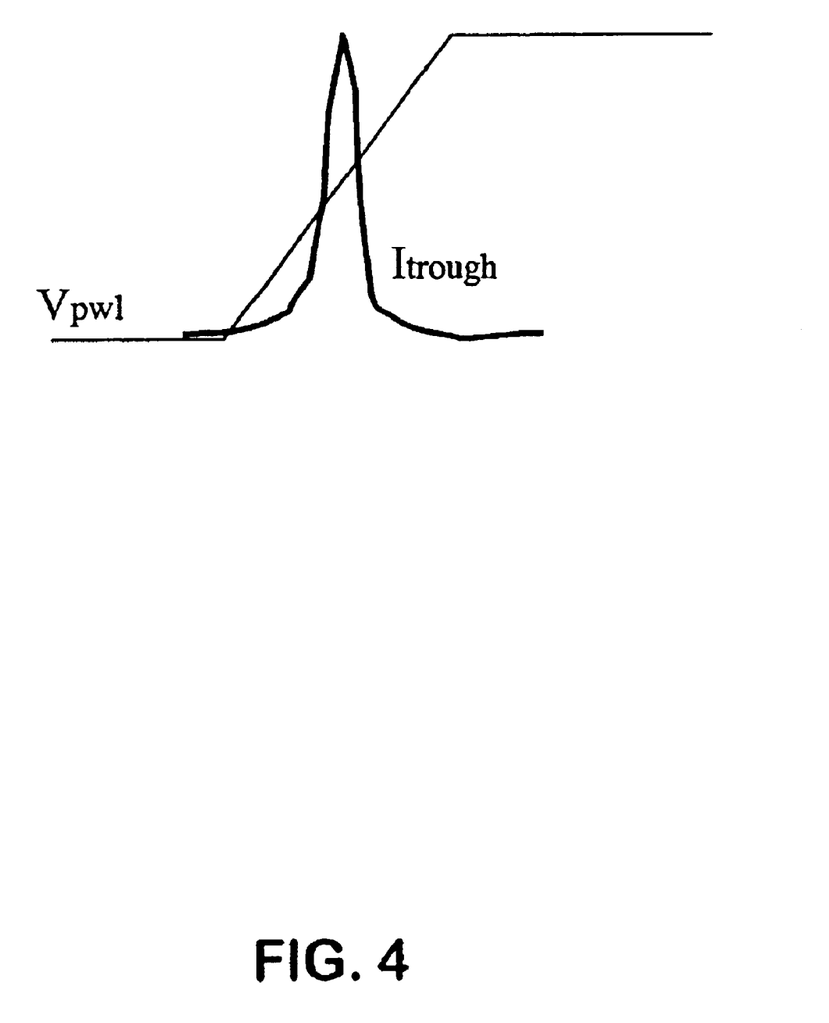
FIG. 4 illustrates a current spike occurring with overlapping switching in the output stage of FIG. 1.

FIG. 4 illustrates a current spike occurring when an overlapping switching is employed for the single-ended switching power output stage of FIG. 1. FIG. 4 shows the course of the input signal $V_{pwl}$ and of the current $I_{through}$ over time. The input signal $V_{pwl}$ is changing gradually from a low level to a high level for switching the output stage in overlapped mode. Both transistors $V_p$ and $V_n$ will conduct at the same time over a certain voltage range of $V_{pwl}$ during this gradual change. This implies that there is a voltage range in which a large current $I_{through}$ will flow through both transistors $V_p$ and $V_n$ during the rising and falling edges of the input signal $V_{pwl}$.

Such current spikes reduce the efficiency of the power amplifier. Further, they cause EMC (electromagnetic compatibility) noise and ripples to the supply voltage line which can disturb the operation of other blocks using the same voltage supply.

A second type of problem occurs if the effective clocking is non-overlapping, as shown in FIG. 3A. Even in case all power switches are turned off simultaneously only for a short period of time, a large voltage over-shoot will occur due to the inductive nature of the load, which tries to keep the current through it flowing. The latter effect is also referred to as "current kickback". The over-shoot voltage magnitude is usually limited to a typical value of one diode drop, i.e. to 0.7 V, by the ESD (electrostatic discharge) circuitry in the IO (input/output) cells. While all power switches are turned off, the current in the load inductance is therefore pushed through the ESD circuitry to the substrate of the chip generating substrate noise. The voltage over-shoot is thus a source of noise for the other circuitry in the same chip.

There is also a potential reliability risk when stressing the ESD circuitry with repeated current spikes occurring during overlapped switching transitions or a repeated voltage over-shoot occurring with non-overlapped switching transitions. The ESD structures can be dimensioned large enough to avoid a degradation of the reliability, but this leads to an increase in semiconductor area which is not required for the regular functions of the power amplifier.

It is also known to avoid the described problems with additional or separate protection devices, like diodes etc. Additional components, however, result as well in an increase of the required space.

Another well-known source of EMC noise in switched power amplifiers is the abrupt edges of the output pulse stream. The spectrum of the output signal contains a significant power at the switching frequency and its harmonics, typically to tens of MHz

SUMMARY OF THE INVENTION

It is an object of the invention to reduce the problems occurring during the switching of the output stage of a switching power amplifier.

This object is reached according to the invention with an electronic circuit for a switching power amplifier, which electrical circuit comprises at least two switching stages forming an output stage. Each of the switching stages comprises at least two controllable power switches and provides an output between the at least two controllable power switches. The at least two switching stages are moreover connected with regard to their outputs in parallel to each other. The proposed electronic device comprises in addition clocking means for switching the controllable power switches of the at least two switching stages. The clocking means switch the controllable power switches of at least one of the switching stages in an overlapped mode and the controllable power switches of at least one other of the switching stages in a non-overlapped mode.

The object of the invention is equally reached with a switching power amplifier comprising the proposed electronic circuit, with an integrated circuit comprising the proposed electronic circuit and with a device comprising a switching power amplifier with the proposed electronic circuit.

Finally, the object of the invention is reached with a method for switching an output stage of a switching power amplifier, which output stage includes at least two switching stages, wherein each of the switching stages includes at least two controllable power switches and provides an output between said at least two controllable power switches, and wherein the at least two switching stages are connected with regard to their outputs in parallel to each other. It is proposed that the method comprising switching the controllable power switches of at least one of the switching stages in an overlapped mode and switching the controllable power switches of at least one other of the switching stages in a non-overlapped mode.

The invention proceeds from the idea that the problems occurring during the switching of the output stage can be avoided, if the output stage is composed of several switching stages in parallel, some of which are clocked in an non-overlapped fashion and some of which are clocked in an overlapped fashion.

Compared to an exclusively overlapped switching of the output stage, it is an advantage of the invention that it reduces the large current rush through the power switches occurring during the transitions to an acceptable level. The reduction of current spikes taken from the power supply leads to a reduction of EMC noise and as well to a reduction ripples caused to the supply voltage line.

Compared to an exclusively non-overlapped switching, it is an advantage of the invention that it reduces the current kickback and the voltage overshoot present with inductive loads. Thereby, also the ESD and substrate noise is reduced.

Moreover, the requirements for the ESD area are relieved, as the power switches of the switching stages with overlapped clocking have an additional role of acting as protection devices, while at the same time current spikes are avoided. The power switches of the output stage according to the invention further have an additional function of smoothing transients and overshoot voltages, thus less or no additional components are needed for protecting the ESD structures.

The total area required for the output stage does not have to be increased either for realizing the invention. For a desired drive capability, it is sufficient to segment the existing area into smaller areas, each comprising one of the switching stages.

An advantage is already reached with a segmentation of the output stage to only one switching stage for which overlapped switching is employed and one switching stage for which non-overlapped switching is employed. But the segmentation can also be extended further to more than 2 parallel switching stages. It might be convenient to select a segmentation of $2^N$ parallel switching stages, where N is a natural number.

In a preferred embodiment of the invention, at least three switching stages are provided and a larger portion of the provided switching stages is switched in an non-overlapped fashion, while a smaller portion of the provided switching stages is switched in an overlapped fashion.

In a further preferred embodiment of the invention, most of the total drive capability is distributed to the switching stages for which a non-overlapped switching is employed, while the rest is distributed to the switching stages for which an overlapped switching is employed. Preferably, about 90% of the total drive capability is distributed to the switching stages for which a non-overlapped switching is employed. As a result, the power provided by the non-overlapping switching stages is higher than the power provided by the overlapping switching stages. Additionally, the physical size of the different switching stages may be different. Alternatively, the size and the drive capability of the different switching stages and the power provided by the different switching stages may be equal.

In another preferred embodiment of the invention, the different non-overlapping switching stages are switched successively with a delay in switching between each switching stage, such that the effective slope of the rising and falling edges at the output of the complete segmented output stage are less abrupt. This attenuates high frequencies of the EMC noise, frequencies above 10 MHz, which is desirable in devices containing RF receivers. The phased clocking required for enabling a switching of the different switching stages with delays in between can be realized in any suitable manner.

In addition to a phased clocking, the segmented switching stages can be dimensioned by dividing the area into segments of unequal sizes. This enables a better control of the high frequency contents of the output of the output stage. For example, the dimensioning can be made such that the edges of the output of the output stage are effectively filtered with a Gaussian filter or with another filter of known properties.

The number and dimensions of the switching stages and the exact sizing of the power switches employed in the switching stages can be selected in any suitable manner.

Further, the employed switching stages can be single-ended output stages as well as differential output stages.

The invention can be implemented with discrete components, but it is most advantageous when the output stage is integrated in a semiconductor circuit. In the latter case, the clocking means could be integrated in addition in the same semiconductor circuit.

The invention is moreover applicable to any switching power amplifiers, in particular to audio switching power amplifiers and RF switching power amplifiers.

BRIEF DESCRIPTION OF THE FIGURES

Other objects and features of the present invention will become apparent from the following detailed description considered in conjunction with the accompanying drawings, wherein FIG. 1 schematically shows an embodiment of a known single-ended output stage.

DETAILED DESCRIPTION OF THE INVENTION

FIGS. 1 to 4 have already been described above.

Figure 5:
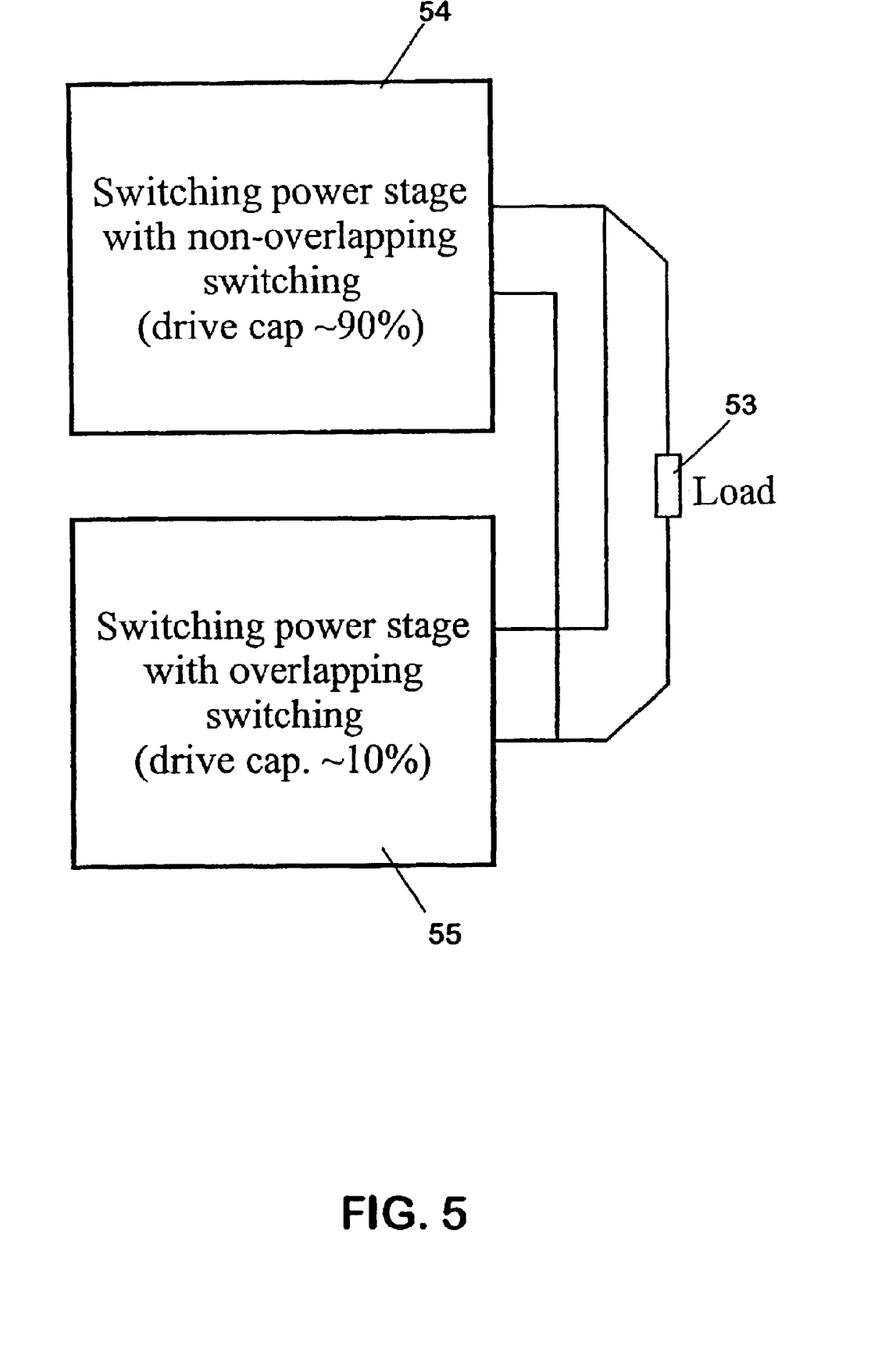
FIG. 5 is a block diagram of an output stage of an embodiment of an electronic circuit according to the invention.

FIG. 5 illustrates a segmentation of an output stage of a first embodiment of a switching power amplifier according to the invention.

The output stage comprises a first switching stage 54 and a second switching stage 55. Each of the switching stages 54, 55 is a differential switching stage. Each switching stage may thus correspond for example to the output stage illustrated schematically in FIG. 2. A respective first output of each of the switching stages 54, 55 is connected to a first connection point of a load 53, while a respective second output of each of the switching stages 54, 55 is connected to a second connection point of the load 53. The two switching stages 54, 55 are thus connected in parallel to the load 53.

The first switching stage 54 is switched by clock signals in a non-overlapping mode as described above with reference to FIG. 3A. The second switching stage 55 is switched by clock signals in contrast in an overlapping mode as described above with reference to FIG. 3B. The clock signals are provided by clocking means of the power amplifier and can be generated based on provided PWM pulses.

Further, about 90% of the drive capacity is distributed to the switching stage 54 for which a non-overlapping switching is employed, while about 10% of the drive capacity is distributed to the switching stage 55 for which an overlapping switching is employed.

With such an output stage composed of a plurality of switching stages, the desired drive capability can be achieved, while at the same time current spikes are avoided and an over-shoot voltage can be controlled.

It is to be noted that the embodiment shown in FIG. 5 can be extended by further differential switching stages connected in parallel to the existing switching stages 54, 55 to the load 53.

In the following, a preferred switching sequence will be presented for an embodiment of an output stage comprising one switching stage for which an overlapping switching is employed and a plurality of switching stages for which a multi-phase non-overlapping switching with an increasing non-overlap time is employed. All of these switching stages are connected in parallel to a load, just as the two switching stages 54, 55 in FIG. 5. About 10% of the drive capability is distributed to the switching stage for which an overlapping switching is employed, and the rest of the drive capability is distributed to the plurality of switching stages for which a non-overlapping switching is employed. Each of the switching stages can have one of two different polarities X, Y. The polarities X and Y correspond in FIG. 2 to phase a and phase b. The switching stages for which a non-overlapping switching is employed can moreover be turned off.

As a starting point, it is assumed that currently the output stage is in the middle of a transition period, and that the switching stage switched in overlapping mode has a polarity of Y, while the switching stages switched in non-overlapping mode are turned off.

At a rising edge of a provided PWM pulse sequence, clocking means switch the switching stage for which an overlapping switching is employed in a first step to a new polarity X.

After a small delay in phase one, a first one of the switching stages for which a non-overlapping switching is employed is switched by the clocking means in a second step from the off state to the new polarity X. The other switching stages for which a non-overlapping switching is employed remain in the off state. After a further small delay in phase two, another switching stage in the off state for which a non-overlapping switching is employed is switched by the clocking means in a third step equally to the new polarity X. Now, a further one of the switching stages for which a non-overlapping switching is employed is conducting with polarity X. The rest of the switching stages for which a non-overlapping switching is employed are still turned off. In next phases, the third step is repeated, until all switching stages have been switched on to the same polarity X.

At a subsequent falling edge of the PWM pulse, the first one of the switching stages for which a non-overlapping switching is employed is turned off again by the clocking means. After respective small delays, also the other stages for which a multi-phase non-overlapping switching is employed are turned off one after the other by the clocking means, until all stages for which a non-overlapping switching is employed have been turned off.

Then, the switching stage for which an overlapping switching is employed is switched by the clocking means to the new polarity Y.

The described sequence is repeated from the second step, except that the polarities X and Y are exchanged.

With the described switching sequence, the resulting pulse edge transitions in the output of the output stage will resemble a staircase waveform instead of one large step. Thereby, it is ensured that the effective switched pulse edges are less abrupt, which leads to a reduction of the high frequency contents of the switched output.

There are several possibilities to realize clocking means generating the required phased clock signals for the proposed switching sequence. Two of these possibilities will be presented.

A very compact solution to create the phased clocks is the use a cross-coupled SR (set/reset) latch with a delayed feedback, as commonly used for creating clock signals in SC (switched capacitor) techniques. Both, the multi-phase non-overlapping and overlapping clocks, can be obtained with this solution by having a suitable number of delay elements in the feedback and by choosing suitable output nodes. In this case the clock signal delays are asynchronous in nature and the overlapping times are defined by the inverter delays in the feedback loop. The rise and fall time of the pulse edges at the output of the output stage corresponds approximately to the product of the number of the switching stages and the inverter delay.

An alternative way to create the phased clocks for effectively slower pulse edges is to use a synchronously clocked logic, in which the switching delay is defined by the clock frequency of the clock generator. In this case, the effective rise and fall time of the pulse edges at the output of the output stage corresponds approximately to the product of the number of the power stages and the logic clock period. This solution allows a good and predictable control of the speed of the output pulse stream edges, and thus the high frequency noise spectrum can be defined more accurately than with asynchronous or other methods not using a robust time reference.

It is to be noted that the described embodiments constitute only selected ones of a variety of possible embodiments of the invention.

What is claimed is:

1. Electronic circuit for a switching power amplifier, which electrical circuit comprises
   at least two switching stages (54,55) forming an output stage, wherein each of said switching stages (54,55) comprises at least two controllable power switches and provides an output between said at least two controllable power switches, and wherein said at least two switching stages (54,55) are connected with regard to their outputs in parallel to each other; and
   clocking means for switching said controllable power switches of said at least two switching stages (54,55), wherein said clocking means switch said controllable power switches of at least one of said switching stages (55) in an overlapped mode and said controllable power switches of at least one other of said switching stages (54) in a non-overlapped mode.

2. Electronic circuit according to claim 1 comprising more than two switching stages, wherein said clocking means switch more switching stages in a non-overlapped mode than in an overlapped mode.

3. Electronic circuit according to claim 1, wherein said clocking means distribute more drive capability to said switching stages (54) switched in a non-overlapped mode than to said switching stages (55) switched in an overlapped mode.

4. Electronic circuit according to one claim 1, wherein said clocking means switch said switching stages (54,55) successively with a respective delay in between.

5. Electronic circuit according to claim 4, wherein said clocking means provides phased clock signals for switching said switching stages successively with a respective delay in between, such that during an off state of the switching stages switched in a non-overlapped mode, first said switching stages switched in an overlapped mode are switched to a new polarity and then said switching stages switched in a non-overlapped mode are switched successively to said new polarity, while during an on state of said switching stages switched in a non-overlapped mode, first said switching stages switched in a non-overlapped mode are switched successively to an off state, and then said switching stages switched in an overlapped mode are switched to a new polarity.

6. Electronic circuit according to claim 4, wherein said clocking means comprise cross-coupled set/reset (SR) latches with a delayed feedback for providing phased clock signals for switching said switching stages successively with a respective delay in between.

7. Electronic circuit according to claim 4, wherein said clocking means comprise a synchronously clocked logic outputting clock signals for switching said switching stages successively with a respective delay in between, such that the respective delay corresponds inversely to a clock frequency of a clock generator.

8. Electronic circuit according to claim 1, wherein said switching stages have different dimensions.

9. Electronic circuit according to claim 1, wherein said switching stages are realized as a single-ended switching stage or as a differential switching stage.

10. Switching power amplifier comprising an electronic circuit according to claim 1.

11. Integrated circuit comprising an electronic circuit for a switching power amplifier according to claim 1.

12. Device comprising a switching power amplifier with an electronic circuit according to claim 1.

13. Method for switching an output stage of a switching power amplifier, which output stage includes at least two switching stages (54,55), wherein each of said switching stages (54,55) includes at least two controllable power switches and provides an output between said at least two controllable power switches, and wherein said at least two switching stages (54,55) are connected with regard to their outputs in parallel to each other, said method comprising switching said controllable power switches of at least one of said switching stages (55) in an overlapped mode and switching said controllable power switches of at least one other of said switching stages (54) in a non-overlapped mode.

14. Method according to claim 13, wherein said output stage comprises more than two switching stages connected in parallel, and wherein more switching stages are switched in a non-overlapped mode than in an overlapped mode.

15. Method according to claim 13, comprising distributing more drive capability to said switching stages (54) operated in a non-overlapped mode than to said switching stages (55) operated in an overlapped mode.

16. Method according to claim 13, wherein said switching stages are switched successively with a respective delay in between.

17. Method according to claim 16, wherein during an off state of the switching stages switched in a non-overlapped mode, first said switching stages switched in an overlapped mode are switched to a new polarity and then said switching stages switched in a non-overlapped mode are switched successively to said new polarity, while during an on state of said switching stages switched in a non-overlapped mode, first said switching stages switched in a non-overlapped mode are switched successively to an off state, and then said switching stages switched in an overlapped mode are switched to a new polarity.

* * * * *